United States Patent [19]

Mimura et al.

[11] 4,359,765
[45] Nov. 16, 1982

[54] MAGNETIZING SYSTEM

[75] Inventors: Katsura Mimura; Kazuo Tsugawa, both of Kobe, Japan

[73] Assignee: Mitsubishi Denki Kabushiki Kaisha, Tokyo, Japan

[21] Appl. No.: 205,595

[22] Filed: Nov. 10, 1980

[30] Foreign Application Priority Data

Feb. 5, 1980 [JP] Japan ............................ 55/13332

[51] Int. Cl.³ .................................. G01R 33/12
[52] U.S. Cl. ......................... 361/147; 361/148; 335/284
[58] Field of Search ............... 361/143, 146, 147, 148; 335/284

[56] References Cited

U.S. PATENT DOCUMENTS

| | | | |
|---|---|---|---|
| 2,930,944 | 3/1960 | Yonkers | 361/148 |
| 4,074,197 | 2/1978 | Bader | 361/146 |
| 4,104,591 | 8/1978 | Reuting | 361/147 |

FOREIGN PATENT DOCUMENTS 2223439  5/1972  Fed. Rep. of Germany ...... 361/147

OTHER PUBLICATIONS

"Precision Magnetizer", Gibb et al., *IBM Tech. Disclosure Bulletin*, vol. 21, No. 11, Apr. 79.
"Handbook of Electrical Engineering", Electric Society of Japan, Apr. 1978, pp. 492–495.
"Manual of Electrical Measurements", J. Yamauchi, Nov. 1966, p. 441.

*Primary Examiner*—G. Z. Rubinson
*Assistant Examiner*—L. C. Schroeder
*Attorney, Agent, or Firm*—Wenderoth, Lind & Ponack

[57] ABSTRACT

A magnetizing system including a FLIP-FLOP and an integrating circuit operative to control a conduction phase of a unidirectional thyristor through a gating circuit so as to supply to an iron-core coil an increasing magnetizing current from an AC source through the thyristor so as to magnetize a horseshoe steel member. When a comparator determines that the magnetization amount of the steel member, sensed by a Hall effect element, equals 1.2 to 1.3 times a reference amount, the magnetizing current is stopped. Similar components for effecting demagnetization are then operated in the same manner so as to demagnetize the steel member with an increasing unidirectional current opposite in sense to the magnetizing current or an increasing bidirectional current until the sensed magnetization amount equals the reference amount. At that time, the demagnetizing current is stopped.

26 Claims, 10 Drawing Figures

MAGNETIZING SYSTEM

BACKGROUND OF THE INVENTION

This invention relates to a magnetizing system for magnetizing a permanent magnet to any desired magnitude.

In order to charge magnetically or magnetize permanent magnets, there have been already known magnetizing systems of the type comprising a U-shaped iron core, a pair of magnetizing coils wound around two legs of the "U" and connected serially to each other to cumulatively produce magnetic fluxes on the legs when the coils are energized, a pair of opposite spaced magnetic pole pieces connected to the free ends of the legs, and a DC source connected across the serially connected magnetizing coils through a normally open switch. A steel workpiece to be magnetized is put on the opposite magnetic pole pieces to bridge them and the switch is closed to cause a current from the DC source to flow through the connected magnetizing coils so as to apply a magnetic field to a magnetic path including the iron core, the magnetic pole pieces and the steel workpiece. Under these circumstance, when the switch is opened to stop the flow of current through the magnetizing coils, the steel workpiece is magnetically charged. That is, a permanent magnet results. Upon this magnetizing, the magnetic field has generally had a field strength not less than that required for the steel workpiece to be magnetically saturated. Then, the permanent magnet thus magnetized is demagnetized in order to stabilize the magnetic characteristics thereof. To this end, the permanent magnet is spaced from the magnetic pole pieces and approaches the magnetic field as described above while the magnetic polarity is reversed from that provided upon the magnetization. The distance to which the permanent magnet approaches the magnetic field has previously relied upon both experiences and the sixth sense of the operator of the system. This has required great skill on the part of the operator and the technique has been poor in its efficiency.

Alternatively, the permanent magnet might be put in an AC demagnetizing field which is varying in its field strength.

After having been demagnetized as described above, the permanent magnet has been measured as to its magnetization value. If the permanent magnet has been insufficiently demagnetizied, as determined by that measurement, it has been necessary to re-demagnetize the magnet. On the contrary, if the permanent magnet has been excessively demagnetized, as determined by the above-noted measurement, then it has been necessary to re-magnetize and then re-demagnetize the magnet. As a result, conventional magnetizing systems such as outlined above have been poor in their workability and accuracy while requiring great skill based on the experience and the sixth sense of the operator.

Accordingly, it is an object of the present invention to provide a new and improved magnetizing system for automatically magnetizing a magnetic workpiece to be magnetized by employing a sensor for sensing the amount of magnetization of the magnetic workpiece.

It is another object of the present invention to provide a new and improved magnetizing system for magnetizing a magnetic workpiece to be magnetized with improved workability and efficiency and without relying on experience and the sixth sense of the operator, resulting in a high quality product.

SUMMARY OF THE INVENTION

The present invention provides a magnetizing system for magnetizing a magnetic workpiece to a desired value, comprising a variable electric source, a magnetization exciting means which is excited by the variable electric source to generate a magnetic flux in a direction in which the magnetic workpiece is to be magnetized or demagnetized, a sensor circuit including a magnetically sensitive means for producing an output in response to the amount of magnetization of the magnetic workpiece so as to sense the amount of magnetization of the magnetic workpiece, a comparison circuit connected to the sensor circuit to compare the sensed result with a reference value to produce an output in accordance with the result of the comparison, and a control circuit responsive to the output from the comparison circuit to control the excitation of the exciting means.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
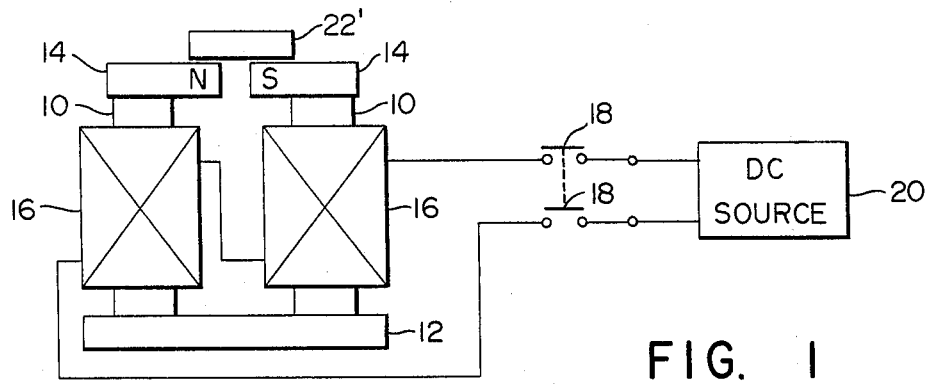
FIG. 1 is a circuit diagram of an outline of a conventional magnetizing system.

Referring now to FIG. 1 of the drawings, there is illustrated a conventional magnetizing system. The illustrated arrangement comprises a U-shaped iron core including a pair of legs 10 erected in a parallel relationship on both end portions of a yoke 12, a pair of opposite spaced magnetic pole pieces 14 fixedly secured to the free ends of the legs 10, and a magnetizing means 16, comprising a coil wound around each of the legs 10, the coils connected together serially. The magnetizing means 16 is connected so that, when energized, it generates magnetic cululative fluxes on the mating legs 10 of the iron core. Then, the serially connected coils 16 are connected via a normally open double pole switch 18 across a DC source 20. A magnetic workpiece 22' to be magnetized is put on the opposite spaced magnetic pole pieces 14 so as to bridge them.

In order to magnetize the magnetic workpiece 22', the normally open switch 18 is first closed to cause a current from the DC source 20 to flow through the interconnected magnetizing coils 16 so as to apply to the magnetic workpiece 22' a magnetic field through a magnetic path including the magnetic workpiece 22', the magnetic pole pieces 14, the legs 10 and the yoke 12. In the illustrated example, the lefthand pole piece 10 as viewed in FIG. 1 forms an N pole and the other or righthand pole piece 10 forms an S pole as shown in FIG. 1. Then, the switch 18 is opened, whereupon the magnetic workpiece 22' is magnetized to form a permanent magnet.

Upon this magnetization, the magnetic field is sufficiently high and has a field strength greater than that required for the magnetic workpiece 22' to be magnetically saturated.

Figure 2:
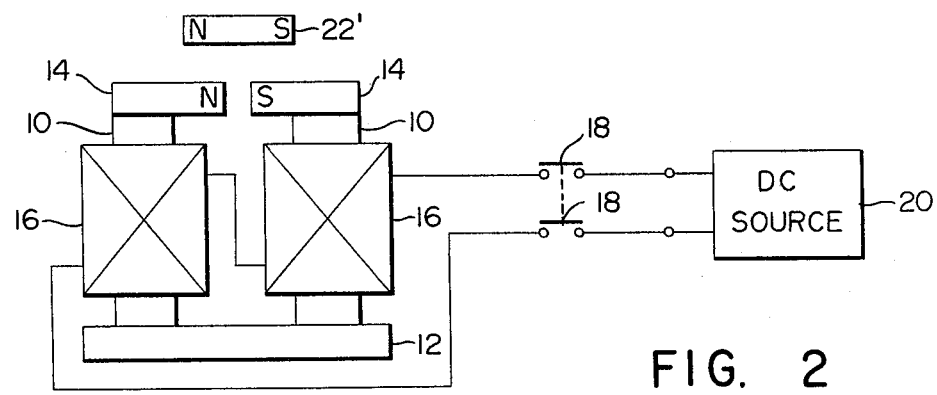
FIG. 2 is a circuit diagram of an outline of a conventional demagnetizing system.
Figure 3:
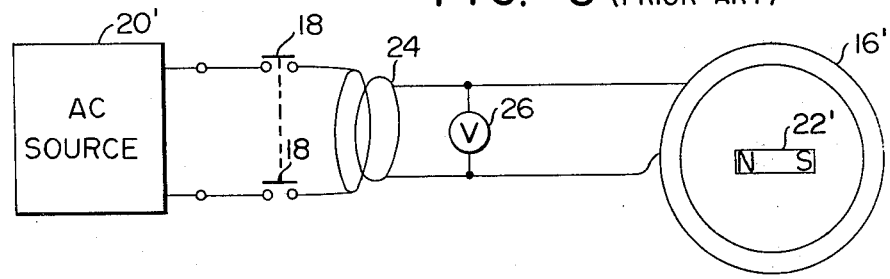
FIG. 3 is a view similar to FIG. 2 but illustrating another conventional demagnetizing system.

The permanent magnet thus formed is then demagnetized by a demagnetizing system such as shown in FIG. 2 or 3.

The arrangement illustrated in FIG. 2 is quite identical to that shown in FIG. 1. In FIG. 2, therefore, like reference numerals have been employed to identify the components identical or corresponding to those shown in FIG. 1. For example, the reference numeral 10 designate a magnetic pole piece and the reference numeral 16 designates a demagnetizing coil.

After having been magnetized, the magnetic workpiece 22' is put above the magnetic pole pieces 10 in the arrangement of FIG. 2 and the system is energized as described above in conjunction with FIG. 1. However, the magnetized workpiece 22' has its magnetic polarity reversed from that developed upon its magnetization. Specifically, the magnetized workpiece 22' is put above the magnetic pole pieces 10 by having its N and S poles facing the N and S poles of the magnetic pole pieces 10 respectively. Under these circumstances, the magnetized workpiece 22' approaches the magnetic pole pieces 10 to thereby be demagnetized. At that time, the determination as to the distance to which the magnetized workpiece 22' approaches the magnetic pole pieces 10 has previously relied upon experience and the six sense of the operator. This has required great skill on the part of the operator and been poor in regard to its resultant efficiency.

The magnetized workpiece 22' may be more easily demagnetized by an AC demagnetizing system as shown in FIG. 3. The illustrated arrangement comprises an AC power source 20', a normally open double pole switch 18 for connecting the AC power sorce 20' to an input to of a variable transformer 24, such as a VARIAC (trade mark), and an AC demagnetizing coil 16' connected to the output of the variable transformer 24 and also across a voltmeter 26.

With the switch 18 closed, the magnetized workpiece 22' is put in an AC magnetic field established by the AC demagnetizing coil 16' which has been excited by the AC power 20' through the variable transformer 24. Then, the transformer 24 is manually operated to change the strength of the AC magnetic field. This results in the demagnetization of the magnetized workpiece or permanent magnet.

After the demagnetization of the magnetized workpiece as described above, a suitable measuring device has been previously used to measure the amount of demagnetization of the permanent magnet. When the magnet is insufficiently demagnetized, as determined by this measurement, it has been necessary to again demagnetize the magnet. On the other hand, if the permanent magnet is excessively demagnetized, as determined by the measurement, then it has been necessary to again magnetize the magnet and then to again demagnetize it. Therefore, the stabilized magnetization of magnetic workpieces had previously been poor in both its workability and accuracy and had inevitably relied upon the experience and the sixth sense of the operator.

The present invention contemplates the elimination of the disadvantages of the prior art practice as described above and uses a Hall effect element to measure the amount of magnetization of a magnetic workpiece or the magnetic field strength of a magnetic workpiece as magnetized.

Figure 4:
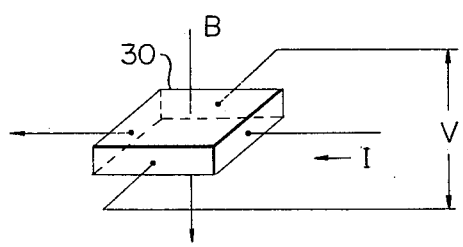
FIG. 4 is a perspective view useful in explaining the principles of the operation of a Hall element.

As is well known, Hall effect elements are frequently applied to measure magnetic field strengths through the utilization of the Hall effect. FIG. 4 shows a Hall effect element 30 in the form of a thin flat square made of a metallic or a semiconductor material. When a constant current I flows through one pair of opposite lateral surfaces of magnetically sensitive means which constitutes the Hall effect element 30 and a magnetic field B is applied to the element 30 in a direction perpendicular to the direction of flow of the current I as shown in FIG. 4, a voltage V is developed across the other pair of opposite lateral surfaces and follows the relationship $V = K \cdot I \cdot B$ where K designates a constant. This relationship is applied to fluxmeters, power measurement devices, etc.

Figure 5:
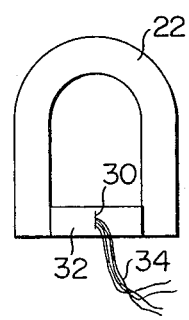
FIG. 5 is a front elevational view of an attachment including a Hall effect element for use with the present invention.
Figure 6:
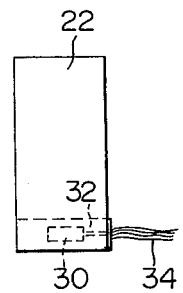
FIG. 6 is a side elevational view of the arrangement shown in FIG. 5.

FIGS. 5 and 6 show a horseshoe or a U-shaped permanent magnet 22 including a rectangular attachment 32 snugly sandwiched between the legs of the "U" so as to be flush with the free ends thereof. Then, a Hall effect element 30 such as that shown in FIG. 4 is buried in the attachment 32 by having its flat opposite surfaces substantially parallel to the legs of the "U" as will ready be understood from the illustration of FIGS. 5 and 6.

Furthermore, one pair of leads are connected to one pair of opposite lateral surfaces of the Hall effect element 30 and the other pair of leads are connected to the other pair of opposite lateral surfaces thereof. All the leads are designated by the reference numeral 34.

A magnetic field established by the magnet 22 is proportional to the amount of magnetization thereof as far as that amount does not exceed the saturation point. Therefore, the amount of magnetization of the magnet 22 can be measured by the arrangement shown in FIGS. 5 and 6.

Assuming that a horsehoe or U-shaped magnetic workpiece is to be magnetized, the present invention will now be described in conjunction with FIG. 7, wherein there is illustrated one embodiment according to the magnetizing system thereof. The illustrated arrangement comprises an AC source of constant voltage 20', a first variable circuit 36 formed of semiconductor elements such as unidirectional thyristors (not shown) and connected across the AC source 20' and a second variable circuit 38 formed of semiconductor elements such as unidirectional thyristors (not shown) and also connected across the AC source 20'. The variable circuits 36 and 38 include respective outputs connected across the magnetizing means 16 comprising the serially connected coils in the arrangement of FIG. 1 having the U-shaped magnetic workpiece 22 substituted for the rod-shaped workpiece 22'. The U-shaped magnetic workpiece 22 includes the attachment 30 having the Hall effect element 30 buried therein as described in conjunction with FIGS. 5 and 6. As is seen from the following description, the AC source 20' and the variable circuit 36 form a variable electrical source for demagnetization, while the AC source 20' and the variable circuit 38 form a variable electrical source for magnetization.

Figure 7:
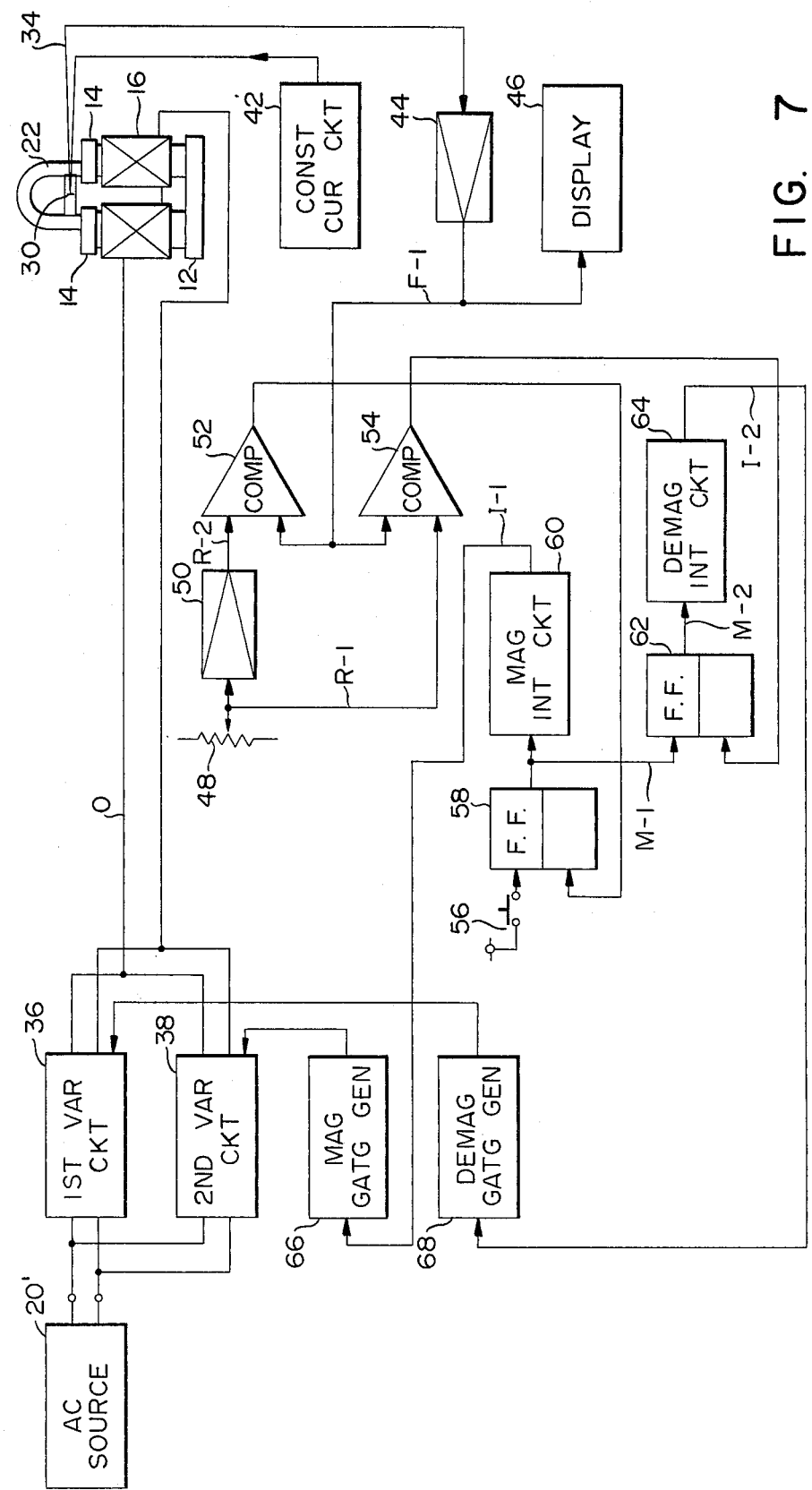
FIG. 7 is a block diagram of one embodiment according to the magnetizing system of the present invention.

One set of leads 34 (which is represented in FIG. 7 by a single lead) is connected to a constant current circuit 42 for applying a predetermined constant current to the Hall effect element 30 and the other set of leads 34 (which is also represented in FIG. 7 by a single lead) is connected to an amplifier 44 for amplifying a voltage developed across the Hall effect element 30. The output of amplifier 42 is then connected to a display device 46 on which the result from the amplifier 44 is displayed.

Reference magnetization setting means, corresponding to a potentiometer 48 which has its movable tap connected to an input of a magnetization comparator 52 through amplifier 50 and is also directly connected to an input of a demagnetization comparator 54. The magnetization and demagnetization comparators 52 and 54 respectively have their other inputs connected to the output of the amplifier 44. Thus, the two comparators 52 and 54 are operative to compare a reference magnetization amount from a movable tap on the potentiometer 48 with an output from the amplifier 44, indicating the amount of magnetization of the magnetic workpiece 22.

The arrangement further comprises a magnetization starting switch 56, a magnetization memory circuit 58 having one input connected to the starting switch 56 and having another input connected to the output of the magnetization comparator 52. The magnetization memory circuit 58 has an output connected to a magnetization integrating circuit 60 and also to one input of a demagnetization memory circuit 62 having the other input thereof connected to the output of the demagnetization comparator 54 and having an output connected to a demagnetization integrating circuit 64. The memory circuits 58 and 62 comprise respective logic circuits, for example, FLIP-FLOP circuits.

Furthermore, the magnetization and demagnetization integrating circuits 60 and 64 are respectively connected to magnetization and demagnetization gating generators 66 and 68, which are, in turn, respectively connected to the second and first variable circuits 38 and 36. The magnetization gating generator 66 form a magnetization control circuit with the memory circuit 58 and the magnetization integrating circuit 60; the demagnetization gating generator 68 forms a demagnetization control circuit with the memory circuit 62, and the demagnetization integrating circuit 64.

The operation of the arrangement shown in FIG. 7 will now be described in conjunction with FIG. 8 wherein there are illustrated waveforms developed at various points therein. After any desired amount of magnetization of the magnetic workpiece 22 has been set by the reference magnetization setting means, i.e. on the tap of the potentiometer 48, the starting switch 56 is depressed to generate a starting signal in the form of the closure of contacts (see waveform START, FIG. 8). The starting signal is applied to the magnetization memory circuit 58 to invert the state latter (see waveform M-1, FIG. 8). This initiates the magnetization integrating circuit 60 to perform the integrating operation to thereby produce a ramp function as shown at waveform I-1 in FIG. 8. That waveform I-1 is applied to the magnetization gating generator circuit 66. Generator 66 then produces a pulse signal having a leading edge used to cause the second variable circuit 38 to supply a unidirectional current to the magnetizing means 16 which is gradually increased in accordance with the waveform I-1 from the magnetization integrating circuit 60 (see the lefthand portion of waveform O, FIG. 8). This results in the magnetization of the magnetic workpiece 22.

On the other hand, the amount of magnetization of the magnetic workpiece 22 is sensed by the Hall effect element 30 having a constant current flowing therethrough from the constant current circuit 42 and the sensed amount is then amplified by the amplifier 44. As shown at waveform F-1 in FIG. 8, an output from the amplifier 44 is linearly increased as the magnetizing current O from the second variable circuit 38 increases to increase the amount of magnetization of the magnetic workpiece 22.

Figure 8:
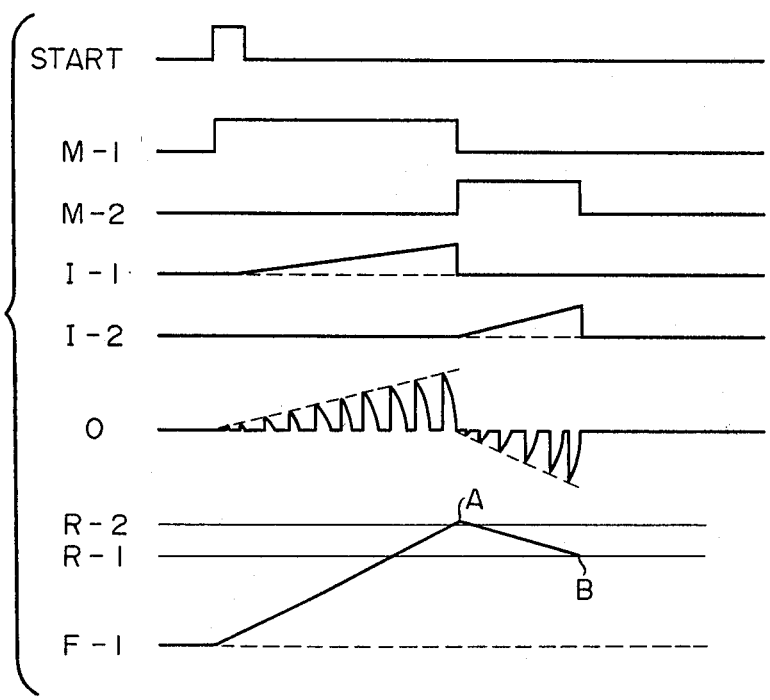
FIG. 8 is a graph illustrating waveforms developed at various points in the arrangement shown in FIG. 7.

Meanwhile, the amplifier 50 amplifies the reference magnetization amount (see waveform R-1, FIG. 8) set by the reference magnetization setting means 48 to from 1.2 to 1.3 times the reference magnetization amount to produce an output as shown at waveform R-2 in FIG. 8. This is because the resulting permanent magnet is stabilized in its magnetic characteristics. It is known that, in order to reduce the secular change in permanent magnets after having been magnetized, the magnets must first be magnetized which is to a magnitude 20 to 30% larger than a set magnitude and then demagnetized to the set magnitude, resulting in the products being stabilized in magnetic their characteristics.

The waveform R-2 is compared with the waveform F-1 from the amplifier 44 by the magnetization comparator 52. When the result of this comparison indicates that the waveform F-1, i.e.-the feedback amount from the amplifier 44, is equal to the waveform R-2 as shown at an intersection A of waveforms R-2 and F-1 in FIG. 8), the output of magnetization comparator 52 is inverted so as to reset the magnetization memory circuit 58 (see waveform M-1, FIG. 8) which thereby resets the output of the associated integrating circuit 60 (see waveform I-1, FIG. 8). By resetting the integrating circuit 60, the second variable circuit 38 is controlled by the magnetization gating generator 66 to stop the magnetizing current as shown at waveform O in FIG. 8. Therefore, the magnetic workpiece 22 has been magnetized to from 1.2 or 1.3 times the reference amount. The components operated as described above are returned back to their original state before the depression of the starting switch 56.

Simultaneously with resetting of the magnetization memory circuit 58, the demagnetization memory circuit 62 is set as shown at waveform M-2 in FIG. 8 to initiate the demagnetization integrating circuit 64 to perform the integrating operation to thereby produce a waveform I-2 shown in FIG. 8 in a similar manner as described above in conjunction with the magnetization integrating circuit 60. The demagnetization gating generator 68 responds to that waveform I-2 to similarly produce a pulse signal leading in phase. Thus, the demagnetizing current generator 38 is initiated to cause a current to flow through the coils 16, in this case, serving as the demagnetizing coils, the current flowing in a direction opposite to that appearing during the magnetization (see the righthand portion of waveform O, FIG. 8). This flow of current increases linearly in accordance with the waveform II-2 to initiate the reduction in the magnetic flux of the magnetized workpiece 22.

This decrease in magnetic flux is sensed by the Hall effect element 30 and then amplified by the amplifier 44. The output from the amplifier 44 is linearly decreased as shown at waveform F-1 in FIG. 8 until it is equal to waveform R-1, i.e. the reference magnitization amount as shown by an intersection B of waveforms R-1 and F-1 in FIG. 8. This amount is determined by the demagnetization comparator 54. At that time, the output of the comparator 54 is inverted so as to reset the demagnetization memory circuit 62 (see waveform M-2, FIG. 8) and therefore, the outputs of the mating integrating circuit 64 is reset (see waveform I-2, FIG. 8).

Accordingly, the demagnetization gating generator 68 controls the demagnetizing current generator 36 to stop the flow of current through the demagnetizing means 16 (see waveform O, FIG. 8). At that time, the demagnetization is completed. In other words, the magnetic workpiece 22 has been properly magnetized. The arrangement of FIG. 7 is returned back to its original state and is ready for the next succeding operation. Then, the magnetic workpiece 22 which has been thus magnetized is removed from the attachment 32 which results in a horseshoe permanent magnet having a field strength equal to the reference magnetization amount set by the reference magnetization setting means 48.

Figure 9:
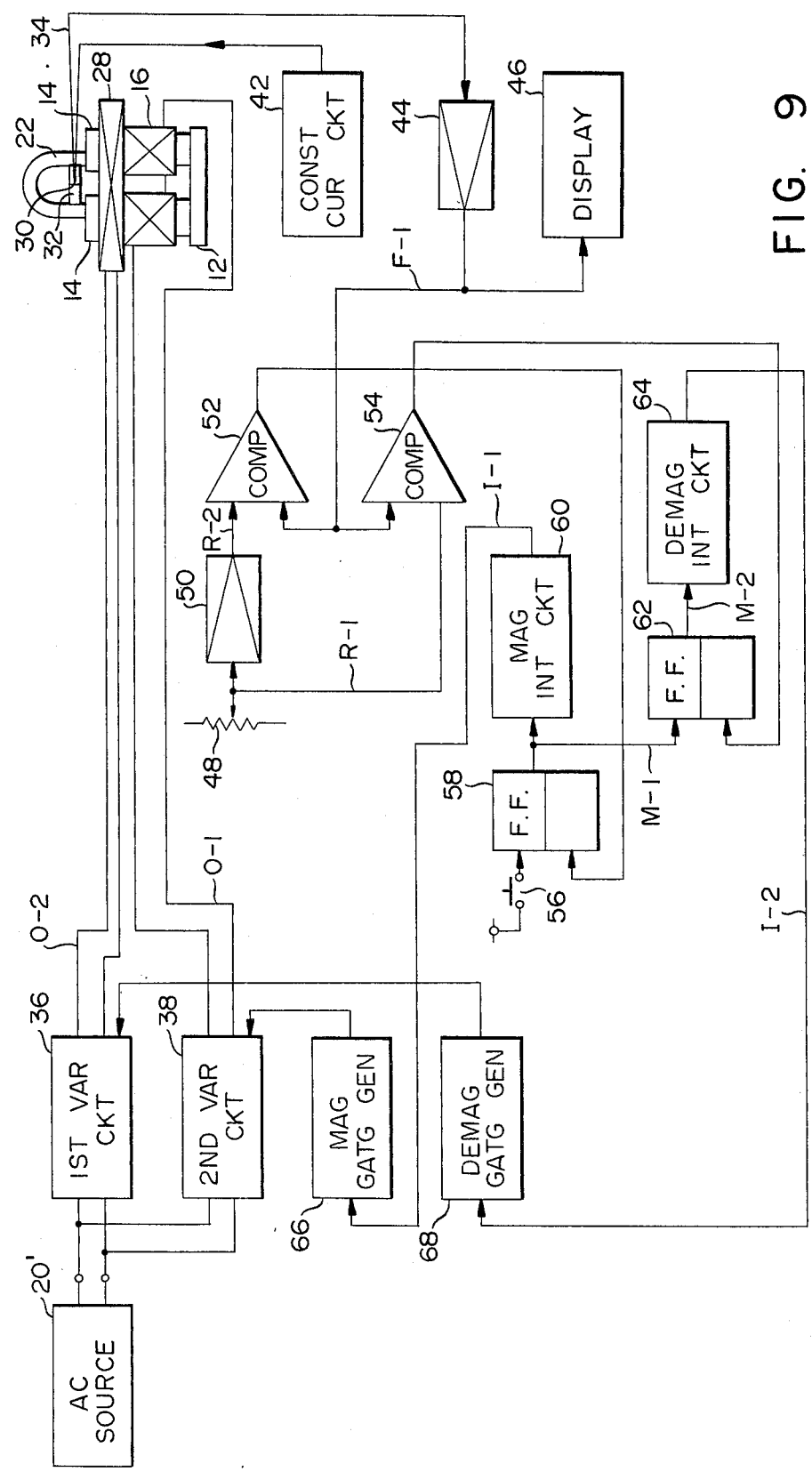
FIG. 9 is a diagram similar to FIG. 7 but illustrating a modification of the present invention.

A modification of the present invention illustrated in FIG. 9 is arranged so as to demagnetize the magnetized workpiece with alternating current. In FIG. 9 a single demagnetizing coil 28 is shown as being wound around the two legs 10 of the "U" and connected across the first variable circuit 36 and the serially connected magnetizing means 16 is shown as being connected only across the second variable circuit 38. The first variable circuit 36 is formed of a bidirectional thyristor (not shown).

In other respects the arrangement is identical to that shown in FIG. 7 and therefore like reference numerals designate the components identical to those shown in FIG. 7.

Figure 10:
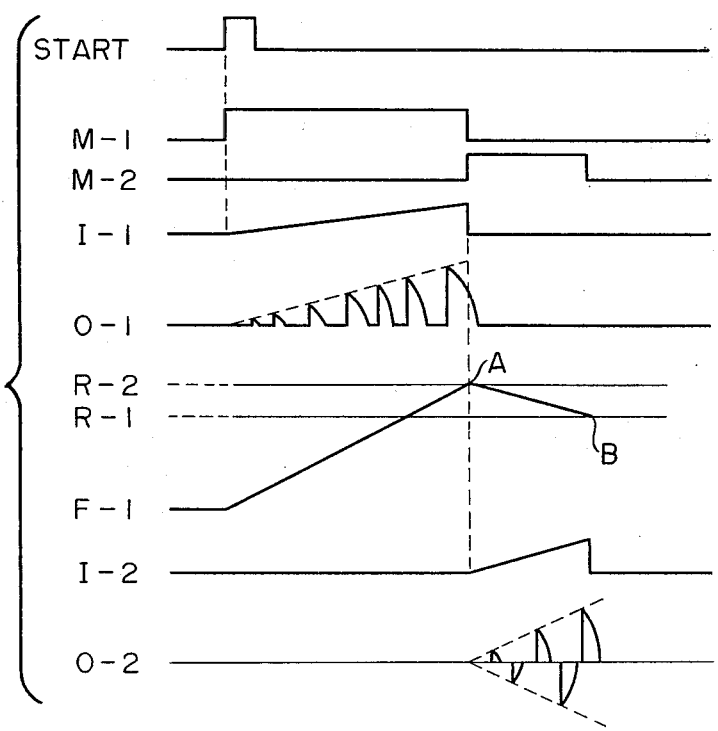
FIG. 10 is a graph illustrating waveforms developed at various points in the arrangement shown in FIG. 9.

In FIG. 10 there are illustrated waveforms developed at various points in the arrangement shown in FIG. 9 and like reference characters and numerals designate the waveforms identical or corresponding to those illustrated in FIG. 8.

The magnetizing operation is performed in the same manner as described above in conjunction with FIGS. 7 and 8 to magnetize the horseshoe magnetic workpiece 22 with a unidirectional current (see waveform O-1, FIG. 10) flowing through the magnetizing means 16 from the second variable circuit 38.

Then, the magnetized workpiece 22 is demagnetized in the same manner as described above in conjunction with FIGS. 7 and 8 except that the first variable circuit 36 supplies an alternating or a bidirectional current to the demagnetizing means 28 increasing smoothly from its null magnitude (see waveform O-2, FIG. 10).

It has been found that, according to the present invention, the working efficiency is distinctively improved and increased to about ten times that previously obtained.

While the present invention has been illustrated and described in conjunction with a few preferred embodiments thereof, it is to be understood that numerous changes and modifications may be resorted to without departing from the spirit and scope of the present invention. For example, the present invention is equally applicable to the production of permanent magnets having any desired shape other than the horseshoe shape described herein. In the latter case the shape of the attachment 32 may be varied to be fitted to that of a magnetic workpiece involved and the Hall effect element is located to sense effectively a magnetic field due to the magnetic workpiece after having been magnetized.

What we claim is:

1. A magnetizing system for magnetizing a magnetic workpiece to the desired magnitude, comprising a variable electric source, magnetization exciting means excited by said variable electric source to generate a magnetic flux in a direction in which said magnetic workpiece is magnetized or demagnetized, a sensor circuit including magnetically sensitive means for producing an output in response to a quantity of magnetization of said magnetic workpiece to sense said quantity of magnetization of said magnetic workpiece, a comparison circuit connected to said sensor circuit to compare the sensed result with a reference to produce an output in accordance with the result of the comparison, and a control circuit responsive to said output from said comparison circuit to control the excitation of said excitating means;
    wherein said variable electric source comprises of a constant electric source and a variable circuit connected to the output of said constant electric source;
    and wherein said constant electric source comprises an AC source of constant voltage and said variable circuit comprises a semiconductor element phase-controlled by said control circuit;
    and wherein said constant electric source comprises an AC source of constant voltage and said variable circuit includes a magnetization variable circuit connected at one end to said AC source of constant voltage and at the other end to said magnetization exciting means and a demagnetization variable circuit connected at one end to said AC source of constant voltage and at the other end to said demagnetization exciting means, the arrangement being so that, said control circuit excites a selected one of said magnetization an demagnetization exciting means thorough the variable circuit connected to said selected exciting means;
    and wherein said variable circuit comprises a thyristor;
    and wherein said magnetization variable circuit is formed of an unidirectional thyristor and said demagnetization variable circuit comprises a bidirectional thyristor.

2. A magnetizing system for magnetizing a magnetic workpiece to the desired magnitude, comprising a variable electric source, magnetization exciting means excited by said variable electric source to generate a magnetic flux in a direction in which said magnetic workpiece is magnetized or demagnetized, a sensor circuit including magnetically sensitive means for producing an output in response to a quantity of magnetization of said magnetic workpiece to sense said quantity of magnetization of said magnetic workpiece, a comparison circuit connected to said sensor circuit to compare the sensed result with a reference to produce an output in acordance with the result of the comparison, and a control circuit responsive to said output from said comparison circuit to control the excitation of said excitating means;
    wherein said variable electric source comprises of a constant electric source and a variable circuit connected to the output of said constant electric source;
    and wherein said constant electric source comprises an AC source of constant voltage and said variable circuit comprises a semiconductor element phase-controlled by said control circuit;

and wherein said comparison circuit comprises a magnetization comparison circuit and a demagnetization comparison circuit.

3. A magnetizing system as claimed in claims 7 or 9 or 11 or 15, wherein said constant electric source comprises an AC source of constant voltage and said variable circuit includes a magnetization variable circuit connected at one end to said AC source of constant voltage and at the other end to said magnetization exciting means and a demagnetization variable circuit connected at one end to said AC source of constant voltage and at the other end to said demagnetization exciting means, the arrangement being so that, said control circuit excites a selected one of said magnetization and demagnetization exciting means through the variable circuit connected to said selected exciting means.

4. A magnetizing system as claimed in claim 2, wherein said control circuit includes a magnetization control circuit connected at the input to the output of said magnetization comparison circuit, and a demagnetization control circuit connected at the input to the output of said demagnetization comparison circuit.

5. A magnetizing system for magnetizing a magnetic workpiece to the desired magnitude, comprising a variable electric source, magnetization exciting means excited by said variable electric source to generate a magnetic flux in a direction in which said magnetic workpiece is magnetized or demagnetized, a sensor circuit including magnetically sensitive means for producing an output in response to a quantity of magnetization of said magnetic workpiece to sense said quantity of magnetization of said magnetic workpiece, a comparison circuit connected to said sensor circuit to compare the sensed result with a reference to produce an output in accordance with the result of the comparison, and a control circuit responsive to said output from said comparison circuit to control the excitation of said excitating means;

and wherein said variable electric source comprises of a constant electric source and a variable circuit connected to the output of said constant electric source;

and wherein said constant electric source comprises an AC source of constant voltage and said variable circuit comprises a semiconductor element phase-controlled by said control circuit;

and wherein said control circuit includes a logic circuit having an output from said comparison circuit applied thereto, said logic circuit composed of an integrating circuit responsive to an output from said logic circuit, and a conduction signal generator circuit response to an output from said integrating circuit to generate a conduction control timing signal for controlling the conduction of said semiconductor element forming said variable circuit.

6. A magnetizing system as claimed in claim 5 wherein said comparison circuit includes a magnetization comparison circuit and a demagnetization comparison circuit, and wherein each of said magnetization and demagnetization comparison circuits is connected at the output to a logic circuit including an integrating circuit connected to the output of said logic circuit and a conduction signal generator circuit successively connected in series circuit relationship on the output side of said logic circuit and a magnetization FLIP-FLOP circuit having a starting signal and an output from said magnetization comparison circuit applied thereto and said logic circuit for the demagnetization is applied with an output from said magnetization FLIP-FLOP circuit and an output from said demagnetization comparison circuit.

7. A magnetizing system for magnetizing a magnetic workpiece to the desired magnitude, comprising a variable electric source, magnetization exciting means excited by said variable electric source to generate a magnetic flux in a direction in which said magnetic workpiece is magnetized or demagnetized, a sensor circuit including magnetically sensitive means for producing an output in response to a quantity of magnetization of said magnetic workpiece to sense said quantity of magnetization of said magnetic workpiece, a comparison circuit connected to said sensor circuit to compare the sensed result with a reference to produce an output in accordance with the result of the comparison, and a control circuit responsive to said output from said comparison circuit to control the excitation of said excitating means;

and wherein said variable electric source comprises of a constant electric source and a variable circuit connected to the output of said constant electric source;

and wherein said constant electric source comprises an AC source of constant voltage and said variable circuit comprises a semiconductor element phase-controlled by said control circuit;

and wherein said constant electric source comprises an AC source of constant voltage and said variable circuit includes a magnetization variable circuit connected at one end to said AC source of constant voltage and at the other end to said magnetization exciting means and a demagnetization variable circuit connected at one end to said AC source of constant voltage and at the other end to said demagnetization exciting means, the arrangement being so that, said control circuit excites a selected one of said magnetization and demagnetization exciting means through the variable circuit connected to said selected exciting means;

and wherein said variable circuit comprises a thyristor;

and wherein said comparison circuit comprises a magnetization comparison circuit and a demagnetization comparison circuit.

8. A magnetizing system as claimed in claim 1, wherein said comparison circuit comprises a magnetization comparison circuit and a demagnetization comparison circuit.

9. A magnetizing system as claimed in claim 7, wherein said control circuit includes a magnetization control circuit connected at the input to the output of said magnetization comparison circuit, and a demagnetization control circuit connected at the input to the output of said demagnetization comparison circuit.

10. A magnetization system as claimed in claim 9, wherein said control circuit includes a magnetization control circuit connected at the input to the output of said magnetization comparison circuit, and a demagnetization control circuit connected at the input to the output of said demagnetization comparison circuit.

11. A magnetizing system for magnetizing a magnetic workpiece to the desired magnitude, comprising a variable electric source, magnetization exciting means excited by said variable electric source to generate a magnetic flux in a direction in which said magnetic workpiece is magnetized or demagnetized, a sensor circuit including magnetically sensitive means for producing an output in response to a quantity of magnetization of said magnetic workpiece to sense said quantity of magnetization of said magnetic workpiece, a comparison circuit connected to said sensor circuit to compare the sensed result with a reference to produce an output in accordance with the result of the comparison, and a control circuit responsive to said output from said comparison circuit to control the excitation of said excitating means;

and wherein said variable electric source comprises of a constant electric source and a variable circuit connected to the output of said constant electric source;

and wherein said constant electric source comprises an AC source of constant voltage and said variable circuit comprises a semiconductor element phase-controlled by said control circuit;

and wherein said constant electric source comprises an AC source of constant voltage and said variable circuit includes a magnetization variable circuit connected at one end to said AC source of constant voltage and at the other end to said magnetization exciting means and a demagnetization variable circuit connected at one end to said AC source of constant voltage and at the other end to said demagnetization exciting means, the arrangement being so that, said control circuit excites a selected one of said magnetization and demagnetization exciting means through the variable circuit connected to said selected exciting means;

and wherein said variable circuit comprises a thyristor;

and wherein said control circuit includes a logic circuit having an output from said comparison circuit applied thereto, said logic circuit is composed of an integrating circuit responsive to an output from said logic circuit, and a conduction signal generator circuit response to an output from said integrating circuit to generate a conduction control timing signal for controlling the conduction of said semiconductor element forming said variable circuit.

12. A magnetizing system as claimed in claim 1, wherein said control circuit includes a logic circuit having an output from said comparison circuit applied thereto, said logic circuit is composed of an integrating circuit responsive to an output from said logic circuit, and a conduction signal generator circuit response to an output from said integrating circuit to generate a conduction control timing signal for controlling the conduction of said semiconductor element forming said variable circuit.

13. A magnetizing system as claimed in claim 2, wherein said control circuit includes a logic circuit having an output from said comparison circuit applied thereto, said logic circuit is composed of an integrating circuit responsive to an output from said logic circuit, and a conduction signal generator circuit response to an output from said integrating circuit to generate a conduction control timing signal for controlling the conduction of said semiconductor element forming said variable circuit.

14. A magnetizing system as claimed in claim 4, wherein said control circuit includes a logic circuit having an output from said comparison circuit applied thereto, said logic circuit is composed of an integrating circuit responsive to an output from said logic circuit, and a conduction signal generator circuit response to an output from said integrating circuit to generate a conduction control timing signal for controlling the conduction of said semiconductor element forming said variable circuit.

15. A magnetizing system as claimed in claim 7, wherein said control circuit includes a logic circuit having an output from said comparison circuit applied thereto, said logic circuit is composed of an integrating circuit responsive to an output from said logic circuit, and a conduction signal generator circuit response to an output from said integrating circuit to generate a conduction control timing signal for controlling the conduction of said semiconductor element forming said variable circuit.

16. A magnetizing system as claimed in claim 8, wherein said control circuit includes a logic circuit having an output from said comparison circuit applied thereto, said logic circuit is composed of an integrating circuit responsive to an output from said logic circuit, and a conduction signal generator circuit response to an output from said integrating circuit to generate a conduction control timing signal for controlling the conduction of said semiconductor element forming said variable circuit.

17. A magnetizing system as claimed in claim 9, wherein said control circuit includes a logic circuit having an output from said comparison circuit applied thereto, said logic circuit is composed of an integrating circuit responsive to an output from said logic circuit, and a conduction signal generator circuit response to an output from said integrating circuit to generate a conduction control timing signal for controlling the conduction of said semiconductor element forming said variable circuit.

18. A magnetizing system as claimed in claim 10, wherein said control circuit includes a logic circuit having an output from said comparison circuit applied thereto, said logic circuit is composed of an integrating circuit responsive to an output from said logic circuit, and a conduction signal generator circuit response to an output from said integrating circuit to generate a conduction control timing signal for controlling the conduction of said semiconductor element forming said variable circuit.

19. A magnetizing system as claimed in claim 15, wherein said comparison circuit includes a magnetization comparison circuit and a demagnetization comparison circuit, and wherein each of said magnetization and demagnetization comparison circuits is connected at the output to a logic circuit including an integrating circuit connected to the output of said logic circuit and a conduction signal generator circuit successively connected in series circuit relationship on the output side of said logic circuit and a magnetization FLIP-FLOP circuit having a starting signal and an output from said magnetization comparison circuit applied thereto and said logic circuit for the demagnetization is applied with an output from said magnetization FLIP-FLOP circuit and an output from said demagnetization comparison circuit.

20. A magnetizing system as claimed in claim 12, wherein said comparison circuit includes a magnetization comparison circuit and a demagnetization comparison circuit and wherein each of said magnetization and demagnetization comparison circuits is connected at the output to a logic circuit including an integrating circuit connected to the output of said logic circuit and a conduction signal generator circuit successively connected in series circuit relationship on the output side of said logic circuit and a magnetization FLIP-FLOP circuit having a starting signal and an output from said magnetization comparison circuit applied thereto and said logic circuit for the demagnetization is applied with an output from said magnetization FLIP-FLOP circuit and an output from said demagnetization comparison circuit.

21. A magnetization system as claimed in claim 13, wherein said comparison circuit includes a magnetization comparison circuit and a demagnetization comparison circuit and wherein each of said magnetization and demagnetization comparison circuits is connected at the output to a logic circuit including an integrating circuit connected to the output of said logic circuit and a conduction signal generator circuit successively connected to series circuit relationship on the output side of said logic circuit and a magnetization FLIP-FLOP circuit having a starting signal and an output from said magnetization comparison circuit applied thereto and said logic circuit for the demagnetization is applied with an output from said magnetization FLIP-FLOP circuit and an output from said demagnetization comparison circuit.

22. A magnetization system as claimed in claim 14, wherein said comparison circuit includes a magnetization comparison circuit and a demagnetization comparison circuit and wherein each of said magnetization and demagnetization comparison circuits is connected at the output to a logic circuit including an integrating circuit connected to the output of said logic circuit and a conduction signal generator circuit successively connected to series circuit relationship on the output side of said logic circuit and a magnetization FLIP-FLOP circuit having a starting signal and an output from said magnetization comparison circuit applied thereto and said logic circuit for the demagnetization is applied with an output from said magnetization FLIP-FLOP circuit and an output from said demagnetization comparison circuit.

23. A magnetization system as claimed in claim 15, wherein said comparison circuit includes a magnetization comparison circuit and a demagnetization comparison circuit and wherein each of said magnetization and demagnetization comparison circuits is connected at the output to a logic circuit including an integrating circuit connected to the output of said logic circuit and a conduction signal generator circuit successively connected to series circuit relationship on the output side of said logic circuit and a magnetization FLIP-FLOP circuit having a starting signal and an output from said magnetization comparison circuit applied thereto and said logic circuit for the demagnetization is applied with an output from said magnetization FLIP-FLOP circuit and an output from said demagnetization comparison circuit.

24. A magnetization system as claimed in claim 16 wherein said comparison circuit includes a magnetization comparison circuit and a demagnetization comparison circuit and wherein each of said magnetization and demagnetization comparison circuits is connected at the output to a logic circuit including an integrating circuit connected to the output of said logic circuit and a conduction signal generator circuit successively connected to series circuit relationshp on the output side of said logic circuit and a magnetization FLIP-FLOP circuit having a starting signal and an output from said magnetization comparison circuit applied thereto and said logic circuit for the demagnetization is applied with an output from said magnetization FLIP-FLOP circuit and an output from said demagnetization comparison circuit.

25. A magnetization system as claimed in claim 21, wherein said comparison circuit includes a magnetization comparison circuit and a demagnetization comparison circuit and wherein each of said magnetization and demagnetization comparison circuits is connected at the output to a logic circuit including an integrating circuit connected to the output of said logic circuit and a conduction signal generator circuit successively connected to series circuit relationship on the output side of said logic circuit and a magnetization FLIP-FLOP circuit having a starting signal and an output from said magnetization comparison circuit applied thereto and said logic circuit for the demagnetization is applied with an output from said magnetization FLIP-FLOP circuit and an output from said demagnetization comparison circuit.

26. A magnetization system as claimed in claim 18, wherein said comparison circuit includes a magnetization comparison circuit and a demagnetization comparison circuit and wherein each of said magnetization and demagnetization comparison circuits is connected at the output to a logic circuit including an integrating circuit connected to the output of said logic circuit and a conduction signal generator circuit successively connected to series circuit relationship on the output side of said logic circuit and a magnetization FLIP-FLOP circuit having a starting signal and an output from said magnetization comparison circuit applied thereto and said logic circuit for the demagnetization is applied with an output from said magnetization FLIP-FLOP circuit and an output from said demagnetization comparison circuit.

* * * * *